United States Patent
Chang et al.

(10) Patent No.: US 10,050,156 B1
(45) Date of Patent: Aug. 14, 2018

(54) RESISTIVE MEMORY ELEMENT

(71) Applicant: OPTO TECH CORPORATION, Hsinchu (TW)

(72) Inventors: Yen-Kai Chang, Taipei (TW); Jun-Wei Peng, New Taipei (TW); Lung-Han Peng, Taipei (TW)

(73) Assignee: OPTO TECH CORPORATION, Hsinchu (TW)

( * ) Notice: Subject to any disclaimer, the term of this patent is extended or adjusted under 35 U.S.C. 154(b) by 0 days.

(21) Appl. No.: 15/666,726

(22) Filed: Aug. 2, 2017

(30) Foreign Application Priority Data

Jun. 26, 2017 (TW) .............................. 106121205 A

(51) Int. Cl.
| | |
|---|---|
| *G11C 11/00* | (2006.01) |
| *H01L 29/8605* | (2006.01) |
| *G11C 13/00* | (2006.01) |
| *H01L 29/267* | (2006.01) |
| *H01L 29/417* | (2006.01) |
| *H01L 33/00* | (2010.01) |

(52) U.S. Cl.
CPC ........ *H01L 29/8605* (2013.01); *G11C 13/004* (2013.01); *G11C 13/0069* (2013.01); *G11C 13/0097* (2013.01); *H01L 29/267* (2013.01); *H01L 29/417* (2013.01); *G11C 2013/005* (2013.01); *G11C 2013/009* (2013.01); *G11C 2213/33* (2013.01); *G11C 2213/34* (2013.01); *G11C 2213/54* (2013.01); *H01L 33/002* (2013.01)

(58) Field of Classification Search
CPC .................................................. G11C 13/0002
USPC ........................................................... 365/148
See application file for complete search history.

(56) References Cited

U.S. PATENT DOCUMENTS

| | | | |
|---|---|---|---|
| 9,142,764 B1 | 9/2015 | Wang | |
| 9,583,675 B1 * | 2/2017 | Peng | ........................ H01L 33/06 |
| 9,786,842 B1 * | 10/2017 | Yan | ........................... H01L 45/06 |
| 9,923,119 B2 * | 3/2018 | Peng | ........................ H01L 33/34 |
| 2010/0284213 A1 * | 11/2010 | Savransky | .......... G11C 11/5678 |
| | | | 365/163 |
| 2013/0292634 A1 * | 11/2013 | Chen | ..................... H01L 27/249 |
| | | | 257/5 |

OTHER PUBLICATIONS

Taiwan Intellectual Property Office, "Office Action", dated Mar. 7, 2018.

* cited by examiner

*Primary Examiner* — Hoai V Ho

(74) *Attorney, Agent, or Firm* — WPAT, PC

(57) ABSTRACT

A resistive memory element includes a P-type layer, a tunneling structure and an N-type layer. The tunneling structure is formed on the P-type layer. The N-type layer is formed on the tunneling structure. When a bias voltage higher than a reset voltage is applied to the P-type layer and the N-type layer, the resistive memory element is in a reset state. When the bias voltage lower than a set voltage is applied to the P-type layer and the N-type layer, the resistive memory element is in a set state.

9 Claims, 4 Drawing Sheets

RESISTIVE MEMORY ELEMENT

This application claims the benefit of Taiwanese Patent Application No. 106121205, filed Jun. 26, 2017, the subject matter of which is incorporated herein by reference.

FIELD OF THE INVENTION

The present invention relates to a resistive memory element, and more particularly to a resistive memory element with a diode structure.

BACKGROUND OF THE INVENTION

A resistive random-access memory (RRAM) is one kind of non-volatile memory. Since the resistive random-access memories have higher accessing speeds, simpler structures, non-volatile properties and higher reliability, the manufacturers of the memories pay much attention to the development of the resistive random-access memories. Moreover, as the semiconducting technology is increasingly developed, the 3D resistive memory with a high-density design becomes a critical research issue.

In the resistive memory, each memory cell comprises a resistive memory element. The resistive memory element may be programmed to different storage states such as a set state and a reset state.

For example, when a set voltage is applied to the two terminals of the resistive memory element, the resistive memory element is in the set state corresponding to a low resistance value. Whereas, when a reset voltage is applied to the two terminals of the resistive memory element, the resistive memory element is in the reset state corresponding to a high resistance value.

SUMMARY OF THE INVENTION

The present invention provides a resistive memory element for a resistive random-access memory (RRAM). The resistive memory element has a novel structure. The resistive memory element comprises a diode structure. The storage state of the resistive memory element is changed to a set state or a reset state when the resistive memory element is forwardly biased voltage or reversely biased.

An embodiment of the present invention provides a resistive memory element. The resistive memory element includes a P-type layer, a tunneling structure and an N-type layer. The tunneling structure is formed on the P-type layer. The N-type layer is formed on the tunneling structure. When a bias voltage higher than a reset voltage is applied to the P-type layer and the N-type layer, the resistive memory element is in a reset state. When the bias voltage lower than a set voltage is applied to the P-type layer and the N-type layer, the resistive memory element is in a set state.

Another embodiment of the present invention provides a resistive memory element. The resistive memory element includes a P-type layer, a tunneling structure and an N-type layer. The tunneling structure is formed on the P-type layer. The N-type layer is formed on the tunneling structure. When a bias voltage higher than a reset voltage is applied to the P-type layer and the N-type layer, the resistive memory element is in a reset state. When a set pulse is applied to the P-type layer and the N-type layer, the resistive memory element is in a set state.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
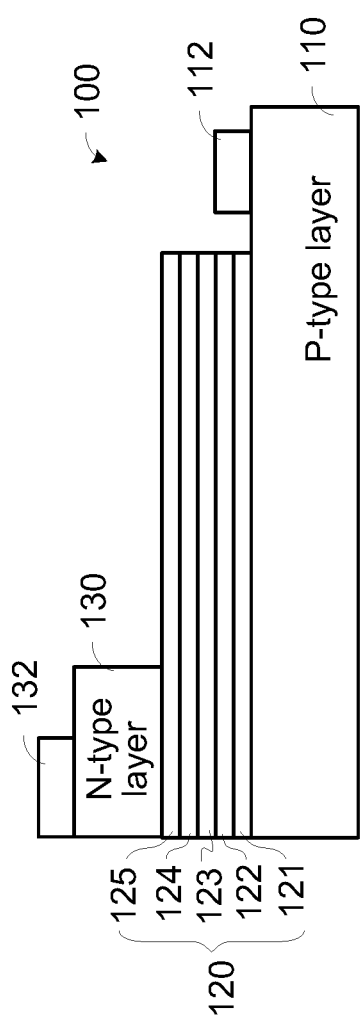
FIG. 1 is a schematic cross-sectional view illustrating the structure of a resistive memory element according to an embodiment of the present invention.

FIG. 1 is a schematic cross-sectional view illustrating the structure of a resistive memory element according to an embodiment of the present invention. As shown in FIG. 1, the resistive memory element 100 comprises a P-type layer 110, a tunneling structure 120 and an N-type layer 130. The resistive memory element 100 further comprises electrode layers 112 and 132. The electrode layer 112 and the P-type layer 110 are in ohmic contact with each other. Similarly, the electrode layer 132 and the N-type layer 130 are in ohmic contact with each other. Alternatively, the electrode layer 112 maybe designed to contact on the back surface of the P-type layer 110.

In an embodiment, the P-type layer 110 is a P-type silicon layer (P-Si), and the N-type layer 130 is an N-type indium tin oxide layer (N-ITO). When the resistive memory element 100 is forwardly biased, the voltage at the electrode layer 112 is higher than the voltage at the electrode layer 132. That is, the voltage applied to the P-type layer 110 is higher than the voltage applied to the N-type layer 130.

When the resistive memory element 100 is reversely biased, the voltage at the electrode layer 112 is lower than the voltage at the electrode layer 132. That is, the voltage applied to the P-type layer 110 is lower than the voltage applied to the N-type layer 130.

In other words, the bias voltage Vpn between the P-type layer 110 and the N-type layer 130 during the forward bias is higher than 0V, and the bias voltage Vpn between the P-type layer 110 and the N-type layer 130 during the reverse bias is lower than 0V.

Moreover, the tunneling structure 120 is a stack structure comprising plural material layers. For example, the tunneling structure 120 is a stack structure comprising a first material layer 121, a second material layer 122, a third material layer 123, a fourth material layer 124 and a fifth material layer 125. The first material layer 121, the second material layer 122, the third material layer 123, the fourth material layer 124 and the fifth material layer 125 are aluminum oxynitride (AlON), gallium oxynitride (GaON), aluminum oxynitride (AlON), gallium oxynitride (GaON)

and aluminum oxynitride (AlON), respectively. The thicknesses of these material layers 121, 122, 123, 124 and 125 are 2 nm, 12 nm, 2 nm, 12 nm and 2 nm, respectively. Moreover, the second material layer 122 and the fourth material layer 124 are quantum well layers, and the first material layer 121, the third material layer 123 and the fifth material layer 125 are barrier layers.

FIGS. 2A~2D are plots illustrating the characteristic curves of the resistive memory element according to an embodiment of the present invention. In this embodiment, the resistive memory element 100 is set in response to the reverse bias voltage.

Figure 2A:
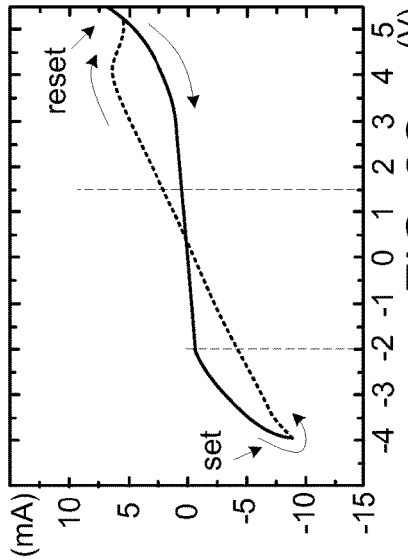
FIGS. 2A~2D are plots illustrating the characteristic curves of the resistive memory element according to an embodiment of the present invention.

As shown in FIG. 2A, the bias voltage Vpn between the P-type layer 110 and the N-type layer 130 is in the range between −2V and +5.5V. The solid line of FIG. 2A indicates the characteristic curve of the resistive memory element 100. For example, the resistive memory element 100 is a light emitting diode (LED).

When the bias voltage Vpn is in the range between −2V and +1.5V, the current flowing through the space between the P-type layer 110 and the N-type layer 130 is very low. That is, the resistive memory element 100 has a high resistance value. Meanwhile, the resistive memory element 100 is in the reset state, and the solid line indicates the characteristic curve in the reset state.

As the bias voltage Vpn is continuously increased to a cut-in voltage (e.g., about 5.5V), the resistive memory element 100 emits light according to the properties of the light emitting diode.

When the resistive memory element 100 is in the reset state and the bias voltage Vpn is changed between −2V and +1.5V, the resistive memory element 100 has the high resistance value.

If the provided bias voltage Vpn is lower than −2V, the resistive memory element 100 is set. That is, the resistive memory element 100 is in the set state. The dotted line of FIG. 2B indicates the characteristic curve in the set state.

When the bias voltage Vpn is −3V under reverse bias, the charges in the tunneling structure 120 of the resistive memory element 100 are depleted. Consequently, the resistive memory element 100 is in the set state corresponding to the low resistance value.

Figure 2B:
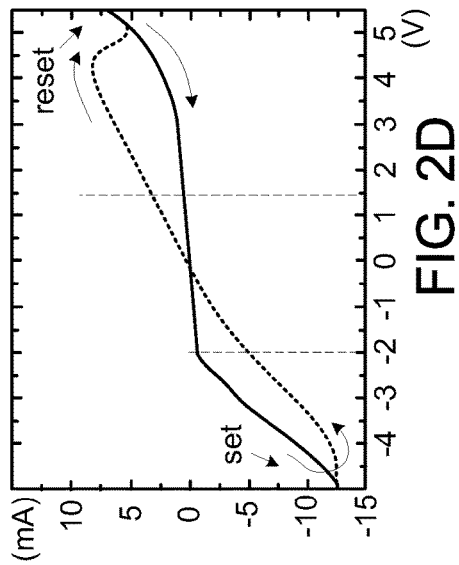

When the resistive memory element 100 is in the set state and the bias voltage Vpn is gradually increased from −3V, the characteristic curve of the resistive memory element 100 is also shown as the dotted line of FIG. 2B. When the bias voltage Vpn is changed between ~2V and 1.5V, the resistive memory element 100 has the low resistance value.

As the bias voltage Vpn is gradually increased from 1.5V, the resistive memory element 100 gradually has the properties of the light emitting diode. As the bias voltage Vpn is continuously increased to a cut-in voltage (e.g., about 5.5V), the resistive memory element 100 emits light according to the properties of the light emitting diode. Meanwhile, the resistive memory element 100 is reset. That is, the resistive memory element 100 is in the reset state corresponding to the high resistance value.

When the resistive memory element 100 is in the reset state and the bias voltage Vpn is gradually decreased from the cut-in voltage (e.g., about 5.5V), the characteristic curve of the resistive memory element 100 is shown as the solid line of FIG. 2B. When the bias voltage Vpn is changed between 1.5V and −2V, the resistive memory element 100 has the high resistance value.

For changing the storage state of the resistive memory element 100 to the set state again, the provided bias voltage Vpn is decreased to −3V. That is, when the bias voltage Vpn is swept between −3V and +5.5V, the resistive memory element 100 is alternately in the set state and the reset state.

If the bias voltage Vpn is lower under reverse bias, more charges of the tunneling structure 120 of the resistive memory element 100 are depleted. Under this circumstance, the resistance value of the resistive memory element 100 in the set state is lower.

Figure 2C:
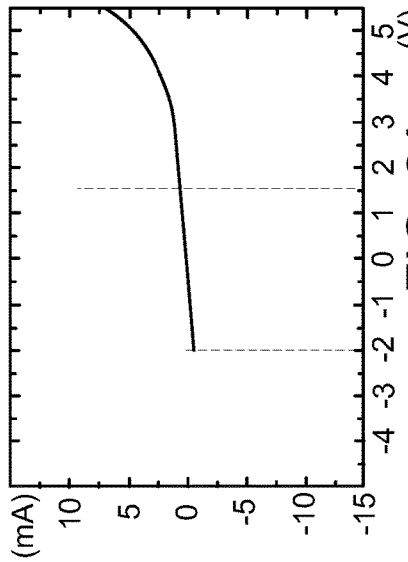

Please refer to FIG. 2C. The bias voltage Vpn of −4V is provided to the resistive memory element 100 under reverse bias. Since the charges in the tunneling structure 120 of the resistive memory element 100 are depleted, the resistive memory element 100 is in the set state corresponding to the low resistance value. Similarly, when the bias voltage Vpn is swept between −4V and +5.5V, the resistive memory element 100 is alternately in the set state and the reset state. In comparison with FIG. 2B, the resistive memory element 100 is in the set state as shown in FIG. 2C has the lower resistance value.

Figure 2D:
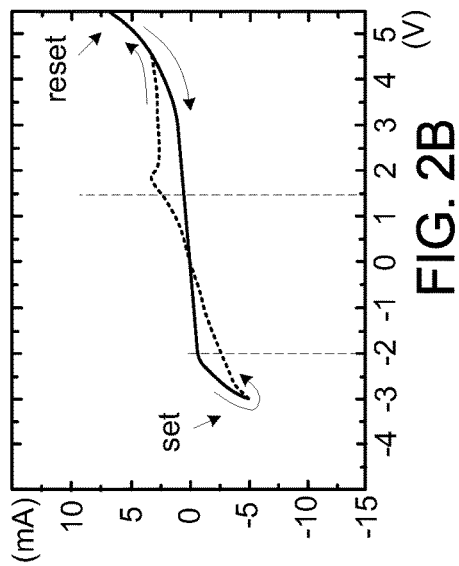

Please refer to FIG. 2D. The bias voltage Vpn of −4V is provided to the resistive memory element 100 under reverse bias. Since the charges in the tunneling structure 120 of the resistive memory element 100 are depleted, the resistive memory element 100 is in the set state corresponding to the low resistance value. Similarly, when the bias voltage Vpn is swept between −5V and +5.5V, the resistive memory element 100 is alternately in the set state and the reset state. In comparison with FIG. 2C, the resistive memory element 100 is in the set state as shown in FIG. 2D has the lower resistance value.

As mentioned above, the resistive memory element 100 is in the set state when the provided bias voltage Vpn is lower than −2V. Moreover, the resistive memory element 100 is in the reset state when the provided bias voltage Vpn is higher than +5.5V. In other words, the reverse bias voltage of −2V is a set voltage, and the forward bias voltage of +5.5V is a reset voltage.

In case that the provided bias voltage Vpn is lower than the set voltage, the resistive memory element 100 is in the set state. In case that the provided bias voltage Vpn is higher than the reset voltage, the resistive memory element 100 is in the reset state.

In different states, the resistive memory element 100 has different resistance values in the voltage range between the −2V and +1.5V. In an embodiment, a read voltage is provided as a bias voltage. The storage state of the resistive memory element 100 is determined as the set state or the reset state according to the magnitude of the current generated by the resistive memory element 100. The read voltage is in the range between −2V and +1.5V.

For example, the read voltage of +0.1V is provided to the resistive memory element 100 as the bias voltage Vpn. In case that the current generated by the resistive memory element 100 is higher than a reference current, the resistive memory element 100 is in the set state. In case that the current generated by the resistive memory element 100 is lower than the reference current, the resistive memory element 100 is in the reset state.

Figure 3:
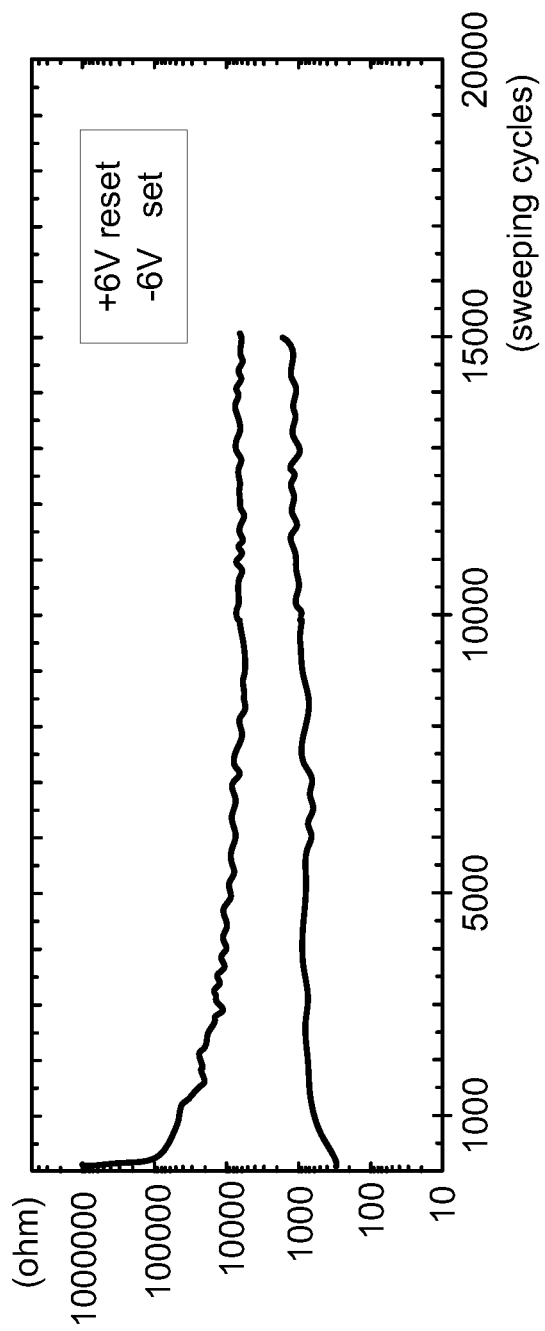
FIG. 3 is a plot illustrating the relationship between the resistance value of the resistive memory element and the number of times of sweeping the bias voltage between +6V and −6V.

FIG. 3 is a plot illustrating the relationship between the resistance value of the resistive memory element and the number of times of sweeping the bias voltage between +6V and −6V. After 15000 sweeping cycles between the reset state and the set state of the resistive memory element 100, the set state and the reset state can still be discriminated according to the resistance value of the resistive memory element 100.

In the above embodiment, the reverse bias voltage lower than −2V is provided for changing the storage state of the resistive memory element 100 to the set state. In some embodiments, a reverse current pulse is provided for changing the storage state of the resistive memory element 100 to the set state. The reverse current pulse flows in the direction from the N-type layer 130 to the P-type layer 110.

FIGS. 4A~4D are plots illustrating the characteristic curves of the resistive memory element according to another embodiment of the present invention. In this embodiment, the resistive memory element 100 is set in response to the reverse current pulse.

Figure 4A:
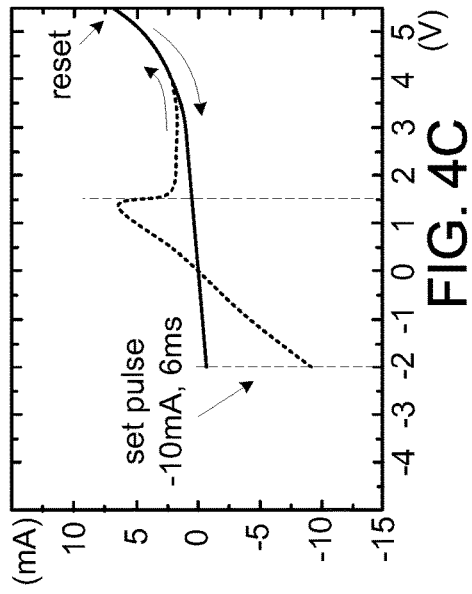
FIGS. 4A~4D are plots illustrating the characteristic curves of the resistive memory element according to another embodiment of the present invention.

As shown in FIG. 4A, the bias voltage Vpn between the P-type layer 110 and the N-type layer 130 is in the range between −2V and +5.5V. The solid line of FIG. 4A indicates the characteristic curve of the resistive memory element 100. For example, the resistive memory element 100 is a light emitting diode (LED).

When the bias voltage Vpn is in the range between −2V and +1.5V, the current flowing through the space between the P-type layer 110 and the N-type layer 130 is very low. That is, the resistive memory element 100 has a high resistance value. Meanwhile, the resistive memory element 100 is in the reset state, and the solid line indicates the characteristic curve in the reset state.

As the bias voltage Vpn is continuously increased to a cut-in voltage (e.g., about 5.5V), the resistive memory element 100 emits light according to the properties of the light emitting diode.

When the resistive memory element 100 is in the reset state and the bias voltage Vpn is changed between −2V and +1.5V, the resistive memory element 100 has the high resistance value.

Figure 4C:
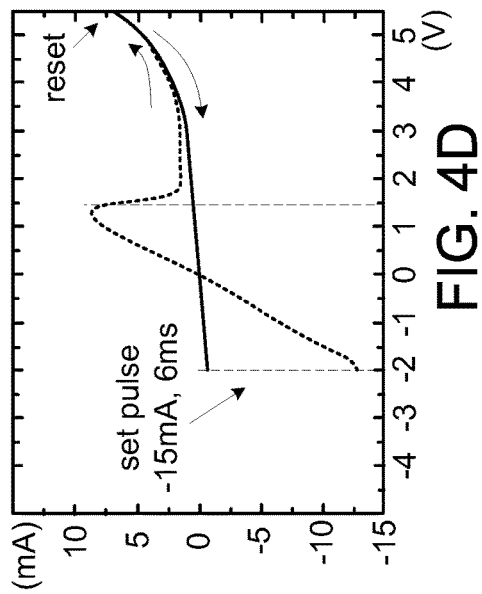
Figure 4B:
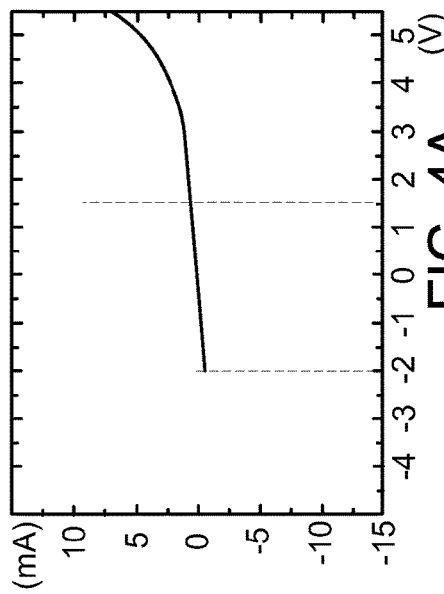

Please refer to FIG. 4B. After a set pulse with an amplitude of −5 mA and a pulse with of 6 ms is provided, the charges in the tunneling structure 120 of the resistive memory element 100 are depleted. Consequently, the resistive memory element 100 is in the set state corresponding to the low resistance value.

When the resistive memory element 100 is in the set state and the bias voltage Vpn is gradually increased from −2V, the characteristic curve of the resistive memory element 100 is also shown as the dotted line of FIG. 4B. When the bias voltage Vpn is changed between ~2V and 1.5V, the resistive memory element 100 has the low resistance value.

As the bias voltage Vpn is gradually increased from 1.5V, the resistive memory element 100 gradually has the properties of the light emitting diode. As the bias voltage Vpn is continuously increased to a cut-in voltage (e.g., about 5.5V), the resistive memory element 100 emits light according to the properties of the light emitting diode. Meanwhile, the resistive memory element 100 is reset. That is, the resistive memory element 100 is in the reset state corresponding to the high resistance value.

When the resistive memory element 100 is in the reset state and the bias voltage Vpn is gradually decreased from the cut-in voltage (e.g., about 5.5V), the characteristic curve of the resistive memory element 100 is shown as the solid line of FIG. 4B. When the bias voltage Vpn is changed between 1.5V and −2V, the resistive memory element 100 has the high resistance value. For changing the storage state of the resistive memory element 100 to the set state again, the reverse current pulse is provided again. That is, the reverse current pulse is used as the set pulse.

If the amplitude of the set pulse is larger, more charges of the tunneling structure 120 of the resistive memory element 100 are depleted. Under this circumstance, the resistance value of the resistive memory element 100 in the set state is lower.

Please refer to FIG. 4C. After a set pulse with an amplitude of −10 mA and a pulse with of 6 ms is provided, the charges in the tunneling structure 120 of the resistive memory element 100 are depleted. Consequently, the resistive memory element 100 is in the set state corresponding to the low resistance value. In comparison with FIG. 4B, the resistive memory element 100 is in the set state as shown in FIG. 4C has the lower resistance value.

Figure 4D:
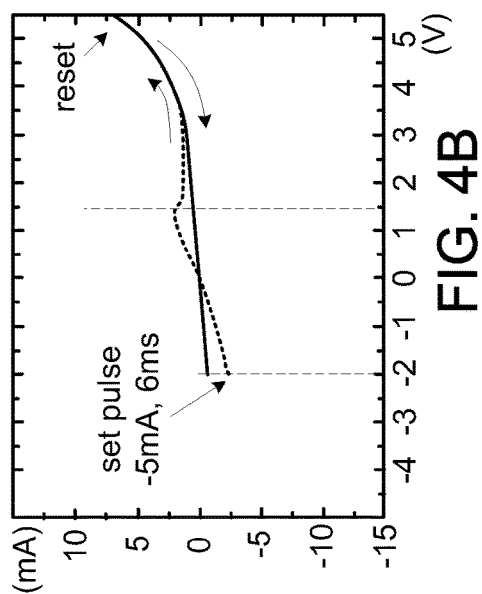

Please refer to FIG. 4D. After a set pulse with an amplitude of −15 mA and a pulse with of 6 ms is provided, the charges in the tunneling structure 120 of the resistive memory element 100 are depleted. Consequently, the resistive memory element 100 is in the set state corresponding to the low resistance value. In comparison with FIG. 4C, the resistive memory element 100 is in the set state as shown in FIG. 4D has the lower resistance value.

From the above descriptions, the present invention provides a resistive memory element with a novel structure. When the resistive memory element 100 is forwardly biased, a bias voltage higher than a reset voltage is provided to the resistive memory element 100. Consequently, the resistive memory element 100 is in the reset state. When the resistive memory element 100 is reversely biased, a bias voltage lower than a set voltage is provided to the resistive memory element 100. Consequently, the resistive memory element 100 is in the set state.

In different states, the resistive memory element 100 has different resistance values in a specified voltage range. A read voltage is provided as a bias voltage. The storage state of the resistive memory element 100 is determined as the set state or the reset state according to the magnitude of the current generated by the resistive memory element 100. The read voltage is within the specified voltage range.

It is noted that the thicknesses of the material layers of the tunneling structure 120 are not restricted. For example, in another embodiment, the thicknesses of these material layers 121, 122, 123, 124 and 125 are 3 nm, 9 nm, 3 nm, 9 nm and 3 nm, respectively.

In the above embodiments, the material layers of the tunneling structure 120 are alternate aluminum oxynitride (AlON) layers and gallium oxynitride (GaON) layers. It is noted that the material layers are not restricted. In another embodiment, the material layers of the tunneling structure 120 are alternate zinc oxynitride (ZnON) layers and gallium oxynitride (GaON) layers, alternate aluminum oxynitride (AlON) layers and hafnium oxynitride (HfON) layers, alternate zinc oxynitride (ZnON) layers and aluminum oxynitride (AlON) layers, alternate zinc nitride (ZnN) layers and aluminum oxynitride (AlON) layers, alternate gallium aluminium oxynitride/zinc oxynitride $(AlGaON)_m(ZnON)_n$ layers and aluminum oxynitride (AlON) layers.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A resistive memory element, comprising:
   a P-type layer;
   a tunneling structure formed on the P-type layer, wherein the tunneling structure is a stack structure comprising a first material layer, a second material layer, a third material layer, a fourth material layer and a fifth material layer; and an N-type layer formed on the tunneling structure, wherein when a bias voltage higher than a reset voltage is applied to the P-type layer and the N-type layer, the resistive memory element is in a reset state, wherein when the bias voltage lower than a set voltage is applied to the P-type layer and the N-type layer, the resistive memory element is in a set state; and wherein the first material layer, the third material layer and the fifth material layers are aluminum oxynitride layers, and the second material layer and the fourth material layer are gallium oxynitride layers.

2. The resistive memory element as claimed in claim 1, further comprising a first electrode layer and a second electrode layer, wherein the first electrode layer is in contact with the P-type layer, and the second electrode layer is in contact with the N-type layer.

3. The resistive memory element as claimed in claim 1, wherein the P-type layer is a P-type silicon layer, and the N-type layer is an N-type indium tin oxide layer.

4. The resistive memory element as claimed in claim 1, wherein when a read voltage is applied to the P-type layer and the N-type layer, the resistive memory element is determined to be in the set state or the reset state according to a magnitude of a current generated by the resistive memory element.

5. A resistive memory element, comprising:
a P-type layer;
a tunneling structure formed on the P-type layer, wherein the tunneling structure is a stack structure comprising a first material layer, a second material layer, a third material layer, a fourth material layer and a fifth material layer; and an N-type layer formed on the tunneling structure, wherein when a bias voltage higher than a reset voltage is applied to the P-type layer and the N-type layer, the resistive memory element is in a reset state, wherein when a set pulse is applied to the P-type layer and the N-type layer, the resistive memory element is in a set state; and wherein the first material layer, the third material layer and the fifth material layers are aluminum oxynitride layers, and the second material layer and the fourth material layer are gallium oxynitride layers.

6. The resistive memory element as claimed in claim 5, further comprising a first electrode layer and a second electrode layer, wherein the first electrode layer is in contact with the P-type layer, and the second electrode layer is in contact with the N-type layer.

7. The resistive memory element as claimed in claim 5, wherein the P-type layer is a P-type silicon layer, and the N-type layer is an N-type indium tin oxide layer.

8. The resistive memory element as claimed in claim 5, wherein when a read voltage is applied to the P-type layer and the N-type layer, the resistive memory element is determined to be in the set state or the reset state according to a magnitude of a current generated by the resistive memory element.

9. The resistive memory element as claimed in claim 5, wherein the set pulse is a reverse current pulse.

* * * * *